United States Patent
Chen et al.

(10) Patent No.: US 9,343,359 B2
(45) Date of Patent: May 17, 2016

(54) INTEGRATED STRUCTURE AND METHOD FOR FABRICATING THE SAME

(71) Applicant: UNITED MICROELECTRONICS CORP., Hsin-Chu (TW)

(72) Inventors: Chun-Hung Chen, Tainan (TW); Ming-Tse Lin, Hsinchu (TW); Yung-Chang Lin, Taichung (TW); Chien-Li Kuo, Hsinchu (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/140,523

(22) Filed: Dec. 25, 2013

(65) Prior Publication Data
US 2015/0179516 A1    Jun. 25, 2015

(51) Int. Cl.
*H01L 21/3205* (2006.01)
*H01L 21/768* (2006.01)
*H01L 23/48* (2006.01)
*H01L 23/532* (2006.01)
*H01L 23/525* (2006.01)

(52) U.S. Cl.
CPC .... *H01L 21/76879* (2013.01); *H01L 21/76846* (2013.01); *H01L 21/76898* (2013.01); *H01L 23/481* (2013.01); *H01L 23/525* (2013.01); *H01L 23/53238* (2013.01); *H01L 2224/023* (2013.01); *H01L 2224/0231* (2013.01); *H01L 2224/02315* (2013.01); *H01L 2224/02373* (2013.01); *H01L 2924/0002* (2013.01)

(58) Field of Classification Search
CPC .............. H01L 2224/023; H01L 2224/0231; H01L 2224/02315; H01L 2224/02335; H01L 2224/0237; H01L 2224/02373; H01L 2224/29008
See application file for complete search history.

(56) References Cited

U.S. PATENT DOCUMENTS

| | | |
|---|---|---|
| 3,150,299 A | 9/1964 | Noyce |
| 3,256,465 A | 6/1966 | Weissenstem |
| 3,323,198 A | 6/1967 | Shortes |
| 3,343,256 A | 9/1967 | Smith |
| 3,372,070 A | 3/1968 | Zuk |
| 3,462,650 A | 8/1969 | Hennings |
| 3,648,131 A | 3/1972 | Stuby |
| 4,394,712 A | 7/1983 | Anthony |
| 4,395,302 A | 7/1983 | Courduvelis |
| 4,616,247 A | 10/1986 | Chang |

(Continued)

OTHER PUBLICATIONS

Kuo,Title of Invention:Interposter Structure and Manufacturing Method Thereof,U.S. Appl. No. 14/025,843, filed Sep. 13, 2013.

(Continued)

*Primary Examiner* — Su C Kim
(74) *Attorney, Agent, or Firm* — Winston Hsu; Scott Margo

(57) ABSTRACT

A method for fabricating integrated structure is disclosed. The method includes the steps of: providing a substrate; forming a through-silicon hole in the substrate; forming a patterned resist on the substrate, wherein the patterned resist comprises at least one opening corresponding to a redistribution layer (RDL) pattern and exposing the through-silicon hole and at least another opening corresponding to another redistribution layer (RDL) pattern and connecting to the at least one opening; and forming a conductive layer to fill the through-silicon hole, the at least one opening and the at least another opening in the patterned resist so as to form a through-silicon via, a through-silicon via RDL pattern and another RDL pattern in one structure.

9 Claims, 2 Drawing Sheets

(56) References Cited

U.S. PATENT DOCUMENTS

| | | |
|---|---|---|
| 4,773,972 A | 9/1988 | Mikkor |
| 4,939,568 A | 7/1990 | Kato |
| 5,214,000 A | 5/1993 | Chazan |
| 5,229,647 A | 7/1993 | Gnadinger |
| 5,286,926 A | 2/1994 | Kimura |
| 5,372,969 A | 12/1994 | Moslehi |
| 5,399,898 A | 3/1995 | Rostoker |
| 5,463,246 A | 10/1995 | Matsunami |
| 5,484,073 A | 1/1996 | Erickson |
| 5,502,333 A | 3/1996 | Bertin |
| 5,627,106 A | 5/1997 | Hsu |
| 5,793,115 A | 8/1998 | Zavracky |
| 5,977,640 A | 11/1999 | Bertin |
| 6,018,196 A | 1/2000 | Noddin |
| 6,143,616 A | 11/2000 | Geusic |
| 6,274,937 B1 | 8/2001 | Ahn |
| 6,309,956 B1 | 10/2001 | Chiang |
| 6,391,777 B1 | 5/2002 | Chen |
| 6,407,002 B1 | 6/2002 | Lin |
| 6,440,640 B1 | 8/2002 | Yang |
| 6,483,147 B1 | 11/2002 | Lin |
| 6,525,419 B1 | 2/2003 | Deeter |
| 6,548,891 B2 | 4/2003 | Mashino |
| 6,551,857 B2 | 4/2003 | Leedy |
| 6,627,985 B2 | 9/2003 | Huppenthal |
| 6,633,083 B2 | 10/2003 | Woo |
| 6,746,936 B1 | 6/2004 | Lee |
| 6,778,275 B2 | 8/2004 | Bowes |
| 6,800,930 B2 | 10/2004 | Jackson |
| 6,812,193 B2 | 11/2004 | Brigham |
| 6,831,013 B2 | 12/2004 | Tsai |
| 6,897,148 B2 | 5/2005 | Halahan |
| 6,924,551 B2 | 8/2005 | Rumer |
| 6,930,048 B1 | 8/2005 | Li |
| 7,034,401 B2 | 4/2006 | Savastiouk |
| 7,052,937 B2 | 5/2006 | Clevenger |
| 7,075,133 B1 | 7/2006 | Padmanabhan |
| 7,098,070 B2 | 8/2006 | Chen |
| 7,111,149 B2 | 9/2006 | Eilert |
| 7,166,913 B2 | 1/2007 | Chinthakindi |
| 7,222,420 B2 | 5/2007 | Moriizumi |
| 7,282,951 B2 | 10/2007 | Huppenthal |
| 7,323,785 B2 | 1/2008 | Uchiyama |
| 7,338,896 B2 | 3/2008 | Vanhaelemeersch |
| 7,402,515 B2 | 7/2008 | Arana |
| 7,432,592 B2 | 10/2008 | Shi |
| 7,531,415 B2 | 5/2009 | Kwok |
| 7,541,677 B2 | 6/2009 | Kawano |
| 7,564,115 B2 | 7/2009 | Chen |
| 7,598,607 B2 | 10/2009 | Chung |
| 7,633,165 B2 | 12/2009 | Hsu |
| 7,732,926 B2 | 6/2010 | Uchiyama |
| 7,795,735 B2 | 9/2010 | Hsu |
| 7,812,426 B2 | 10/2010 | Peng |
| 7,816,227 B2 | 10/2010 | Chen |
| 7,825,024 B2 | 11/2010 | Lin |
| 7,825,517 B2 | 11/2010 | Su |
| 7,843,064 B2 | 11/2010 | Kuo |
| 7,846,837 B2 | 12/2010 | Kuo |
| 7,851,346 B2 | 12/2010 | Lee |
| 7,928,534 B2 | 4/2011 | Hsu |
| 7,932,608 B2 | 4/2011 | Tseng |
| 7,939,941 B2 | 5/2011 | Chiou |
| 7,955,895 B2 | 6/2011 | Yang |
| 7,956,442 B2 | 6/2011 | Hsu |
| 7,969,013 B2 | 6/2011 | Chen |
| 8,026,592 B2 | 9/2011 | Yoon |
| 8,034,708 B2 | 10/2011 | Kuo |
| 8,049,327 B2 | 11/2011 | Kuo |
| 8,053,898 B2 | 11/2011 | Marcoux |
| 8,053,900 B2 | 11/2011 | Yu |
| 8,053,902 B2 | 11/2011 | Chen |
| 8,063,496 B2 | 11/2011 | Cheon |
| 2001/0038972 A1 | 11/2001 | Lyons |
| 2004/0080041 A1 | 4/2004 | Kimura |
| 2004/0188817 A1 | 9/2004 | Hua |
| 2005/0112997 A1 | 5/2005 | Lin |
| 2005/0136635 A1 | 6/2005 | Savastiouk |
| 2005/0205991 A1 | 9/2005 | Chen |
| 2006/0035146 A1 | 2/2006 | Hayashi |
| 2006/0042834 A1 | 3/2006 | Lee |
| 2007/0001266 A1* | 1/2007 | Arana ............... H01L 21/2885 257/621 |
| 2007/0117348 A1 | 5/2007 | Ramanathan |
| 2007/0126085 A1 | 6/2007 | Kawano |
| 2007/0190692 A1 | 8/2007 | Erturk |
| 2008/0073747 A1 | 3/2008 | Chao |
| 2008/0108193 A1 | 5/2008 | You |
| 2009/0127667 A1 | 5/2009 | Iwata |
| 2009/0134498 A1 | 5/2009 | Ikeda |
| 2009/0180257 A1 | 7/2009 | Park |
| 2009/0224405 A1 | 9/2009 | Chiou |
| 2010/0001379 A1 | 1/2010 | Lee |
| 2010/0038800 A1* | 2/2010 | Yoon et al. ............... 257/774 |
| 2010/0140749 A1 | 6/2010 | Kuo |
| 2010/0140772 A1 | 6/2010 | Lin |
| 2010/0178761 A1* | 7/2010 | Chen et al. ............... 438/613 |
| 2010/0244247 A1 | 9/2010 | Chang |
| 2010/0323478 A1 | 12/2010 | Kuo |
| 2012/0133048 A1* | 5/2012 | Lee ............... H01L 21/76898 257/774 |
| 2012/0276733 A1 | 11/2012 | Saeki |

OTHER PUBLICATIONS

Jubao,Title of Invention:Semiconductor Device and Method of Fabricating Through Silicon Via Structure,U.S. Appl. No. 13/685,724, filed Nov. 27, 2012.

* cited by examiner

INTEGRATED STRUCTURE AND METHOD FOR FABRICATING THE SAME

BACKGROUND OF THE INVENTION

1. Field of the Invention

The invention relates to a method for fabricating integrated structure, and more particularly, to a method of forming through-silicon via and redistribution layer (RDL) pattern in one structure.

2. Description of the Prior Art

In electronics, a three-dimensional integrated circuit (3D IC, 3D-IC, or 3-D IC) is a chip with two or more layers of active electronic components (semiconductor devices), integrated both vertically and horizontally into a single circuit. The semiconductor industry is hotly pursuing this promising technology in many different forms. Consequently, the definition is still not yet completely fixed. 3D packaging saves space by stacking separate chips in a single package. This packaging, known as System in Package (SiP) or Chip Stack MCM, does not integrate the chips into a single circuit. The chips in the package communicate with off-chip signaling, much as if they were mounted in separate packages on a normal circuit board. In contrast, a 3D IC is effectively a single chip. All components on the layers communicate with on-chip signaling, whether vertically or horizontally. Essentially, a 3D IC bears the same relation to a 3D package that an SoC bears to a circuit board. An additional advantage of 3D IC is the reduced RC delays (no "slow" off-chip signaling, but only fast on-chip signaling).

When integrated circuits (semiconductor devices) are stacked there is also a need for interconnections that extend through the substrate of the semiconductor devices. Such through-substrate interconnections are also called through-substrate vias. Furthermore, as the location of the through-substrate vias may be different between the respective semiconductor devices there has been a need to make an interfacing layer between the semiconductor devices. This layer is also called the redistribution layer. The redistribution layer is typically manufactured after the back-end-of-line stage (BEOL) of the process. The back-end-of-line stage is the stage in which the interconnect stack of the semiconductor device is manufactured. In other words, the redistribution layer is provided after provision of the passivation layer which is considered to be the last BEOL-step in the manufacturing of a semiconductor device.

The redistribution layer typically comprises at least one redistribution conductor which serves to reroute the location of a through-substrate via of the semiconductor device to another location such that the further semiconductor device, which has a different location of the through-substrate via, can be stacked on the semiconductor device. Another function of the redistribution layer is to make contacting of the through-substrate vias easier (bond-pad function).

Current approach for fabricating TSV conductors and redistribution conductors typically requires multiple patterning process and masks for forming the conductors separately. This approach extends cycle time and affects the overall throughput of the process significantly. Hence, how to effectively improve the current approach for resolving these issues has become an important task in this field.

SUMMARY OF THE INVENTION

According to a preferred embodiment of the present invention, a method for fabricating integrated structure is disclosed. The method includes the steps of: providing a substrate; forming a through-silicon hole in the substrate; forming a patterned resist on the substrate, wherein the patterned resist comprises at least one opening corresponding to a redistribution layer (RDL) pattern and exposing the through-silicon hole and at least another opening corresponding to another redistribution layer (RDL) pattern and connecting to the at least one opening; and forming a conductive layer to fill the through-silicon hole, the at least one opening and the at least another opening in the patterned resist so as to form a through-silicon via, a through-silicon via RDL pattern and another RDL pattern in one structure.

According to another aspect of the present invention, a method for fabricating integrated structure is disclosed. The method includes the steps of: providing a substrate; forming a through-silicon hole in the substrate; forming a patterned resist on the substrate, wherein the patterned resist comprises at least one opening corresponding to a redistribution layer (RDL) pattern and exposing the through-silicon hole and at least another opening corresponding to another RDL pattern and connecting to the at least one opening; performing a first electrochemical deposition (ECD) process step and a second ECD process step to fill the through-silicon hole; and performing a third ECD process step to till the at least one opening and the at least another opening in the pattern resist.

According to another aspect of the present invention, an integrated structure is disclosed. The integrated structure includes: a through-silicon hole in a substrate; a first conductive portion in the through-silicon hole; a barrier layer between the first conductive portion and the substrate; a second conductive portion on the first conductive portion and the substrate; and a third conductive portion connected to the second conductive portion. Preferably, the sidewalls of the second conductive portion and the third conductive portion comprise no barrier layer thereon.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
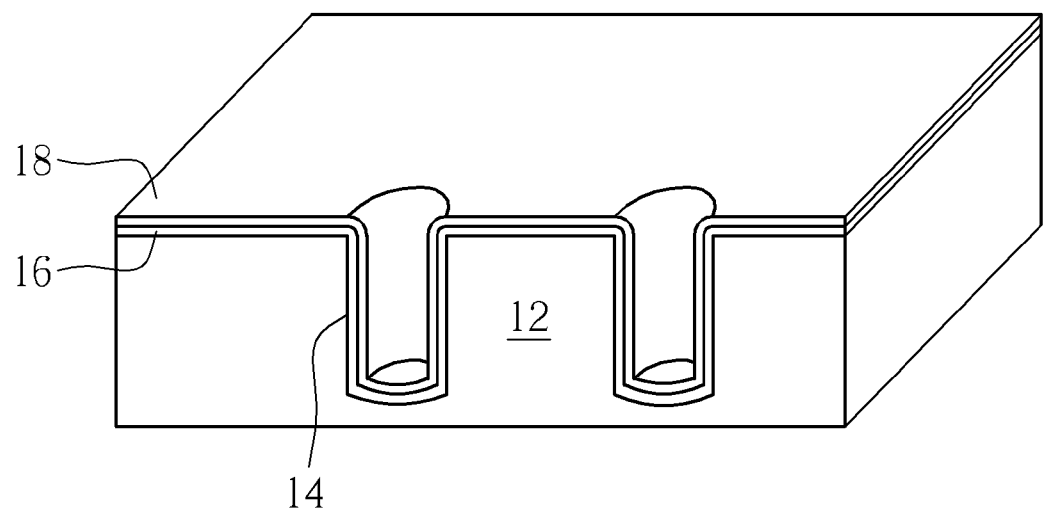
FIGS. 1-4 illustrate a method for fabricating integrated structure according to a preferred embodiment of the present invention.

Referring to FIGS. 1-4, FIGS. 1-4 illustrate a method for fabricating integrated structure from a backside of a wafer or substrate according to a preferred embodiment of the present invention. As shown in FIG. 1, a substrate 12 is first provided, in which the substrate 12 could be composed of monocrystalline silicon, gallium arsenide (GaAs), silicon on insulator (SOI) layer, epitaxial layer, or other known semiconductor material, but not limited thereto.

Next, at least one photolithography and at least one etching processes are conducted to form at least a through-silicon hole 14 in the substrate 12, and a liner 16 is formed on the top surface of the substrate 12 and sidewalls and bottom of the through-silicon hole 14. The liner 16 is preferably consisting of silicon oxide or silicon nitride, and could also be a single or composite layer. The liner 16 is preferably conformally formed lining the top surface of the substrate 12 and sidewalls and bottom of the through-silicon hole 14. Or the liner 16 is formed by oxidizing the substrate.

Next, a barrier layer 18 and an optional seed layer (not shown) are formed on the liner 16 in this order. The barrier layer 18 is preferably selected from a group consisting of Ta, TaN, Ti, and TiN, but not limited thereto. The optional seed layer is preferably consisting of copper, but not limited thereto. In this embodiment, the optional seed layer is preferably deposited by a physical vapor deposition (PVD) process, but could also be formed by an electroless process, which is also within the scope of the present invention.

Figure 2:
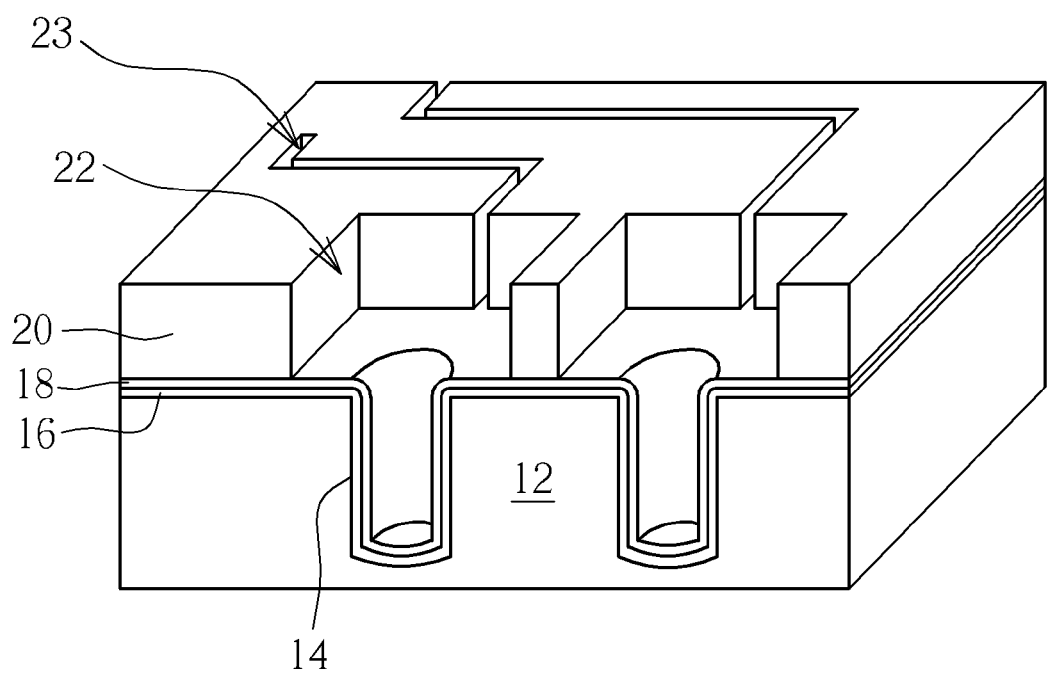

As shown in FIG. 2, a patterned resist 20 is then formed on the optional seed layer (not shown) and the substrate 12, in which the patterned resist 20 includes at least one opening 22 corresponding to a redistribution layer (RDL) pattern for exposing the through-silicon hole 14 and at least another opening 23 corresponding to another redistribution layer (RDL) pattern and connecting to the at least one opening 22. It should be noted in alternative to deposit the seed layer before forming the opening 22, the aforementioned seed layer could also be deposited by electroless process after the opening 22 is formed, which is also within the scope of the present invention.

Figure 3:
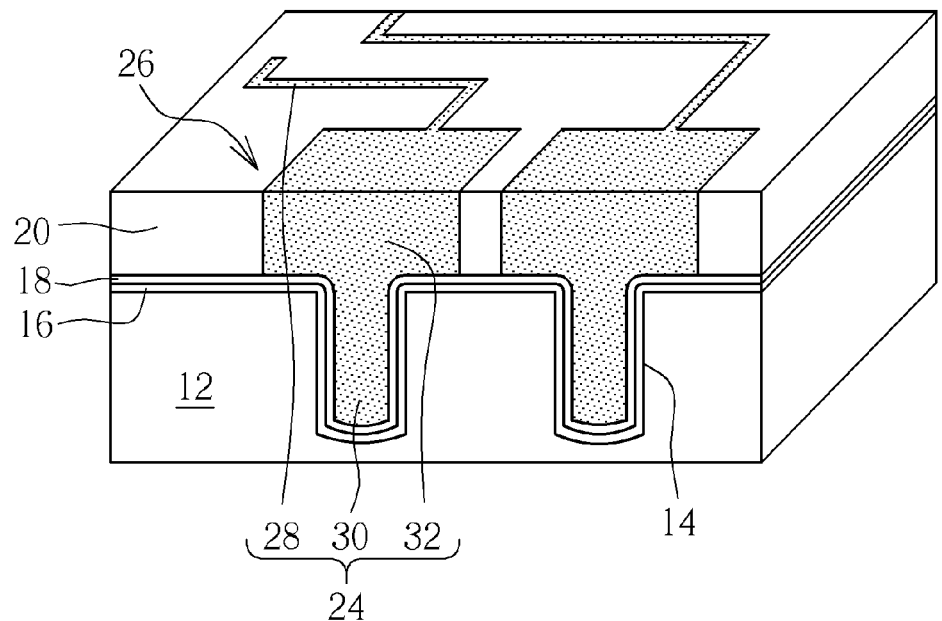

Next, as shown in FIG. 3, a conductive layer 24 is formed to fill the through-silicon hole 14 and the opening 22 in the patterned resist 20 so as to form a through-silicon via (TSV) 30, a TSV RDL pattern 26 and another RDL pattern 28 in one structure. The conductive layer 24 preferably includes a first conductive portion 30 in the through-silicon hole 14, a second conductive portion 32 on the first conductive portion 30, and a third conductive portion 28 connected to the second conductive portion 32. The first, second and third conductive portions serves as a through silicon via, a RDL for connection and a RDL for routing respectively.

According to a preferred embodiment of the present invention, the formation of the conductive layer 24 is accomplished by performing at least three electrochemical deposition (ECD) process steps insituly to fill a conductive layer 24 into the through-silicon hole 14, in which the ECD process steps are preferably accomplished by an electrochemical plating, but not limited thereto. Preferably, these three ECD process steps are performed continuously without other steps or processes interposed therebetween.

According to a preferred embodiment of the present invention, the first ECD process step and the second ECD process step are conducted to substantially fill approximately 85% to 100% of the through-silicon hole 14 for forming the first conductive portion 30 while the third ECD process step is carried out to fill the openings 22 and 23 for forming the TSV RDL pattern 26 and the another RDL pattern 28. Despite the fact that the TSV 30, the TSV RDL pattern 26, and the another RDL pattern 28 are formed together in one single recipe without overfilling or underfilling any of the conductive portions, it should be noted that while the electrical currents in the three ECD process steps are preferably different from each other, the recipe settings and ratio distributions of the electrical currents utilized in each stage are preferably dependent upon the densities between the TSV and the RDL patterns. Furthermore, it is possible to add additional ECD steps after the third ECD step and adjust deposition time of the ECD steps in order to achieve uniform thickness of the RDL patterns and to minimize the thickness loading effect across the entire substrate.

Figure 4:
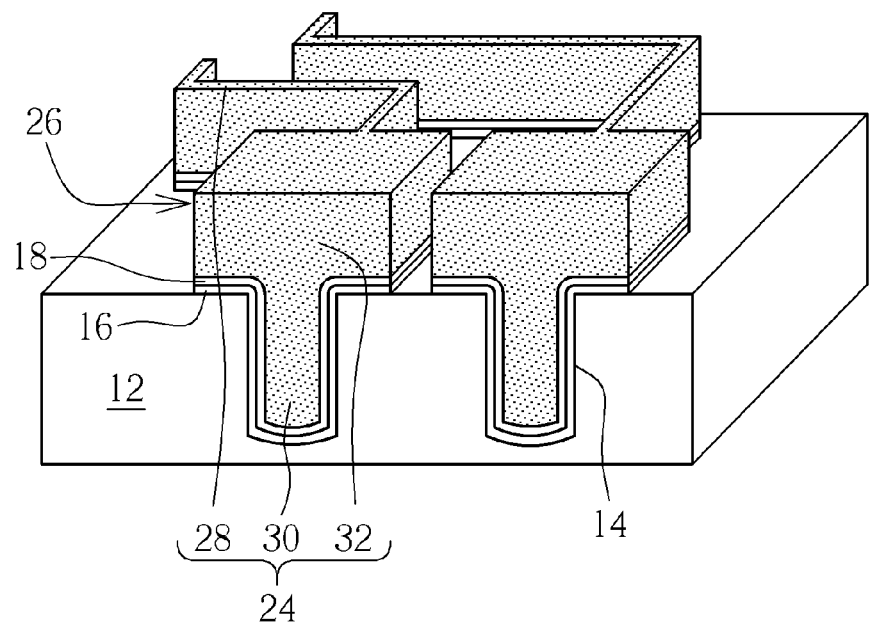

After the TSV RDL pattern 26 and the RDL pattern 28 are formed, as shown in FIG. 4, the patterned resist 20 is removed, and the barrier layer 18 and liner 16 outside the TSV RDL pattern 26 and the RDL pattern 28 on the substrate 12 are removed thereafter. This completes the fabrication of a TSV structure according to a preferred embodiment of the present invention.

It should be noted that despite the fact that the aforementioned embodiment pertains to a via-last approach of fabricating TSV on a backside of a wafer or substrate, the method could also be applied to fabricate TSV on a front side of a wafer or substrate, which is also within the scope of the present invention.

According to an embodiment of the present invention, a TSV structure is also disclosed from the aforementioned process. The TSV structure preferably includes a through-silicon hole 14 in a substrate 12, a first conductive portion 30 in the through-silicon hole 14, a liner 16 and a barrier layer 18 between the first conductive portion 30 and the substrate 12, a second conductive portion 32 on the first conductive portion 30 and the substrate 12, and a third conductive portion 28 connected to the second conductive portion 32. Preferably, the sidewalls of the second conductive portion 32 and the third conductive portion 28 have no barrier layer 18 thereon. The first conductive portion 30, the second conductive portion 32, and the third conductive portion 28 preferably serving as a through-silicon via, a RDL for connection, and a RDL for routing respectively, in which the three portions 28, 30, 32 are consisting of same material, preferably copper, and the barrier layer 18 is selected from a material consisting of Ta, TaN, Ti, and TiN.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating integrated structure, comprising:
   providing a substrate;
   forming a through-silicon hole in the substrate;
   forming a liner and a barrier layer on the substrate and a bottom and sidewalls of the through-silicon hole;
   forming a patterned resist on the substrate, wherein the patterned resist comprises at least one opening corresponding to a redistribution layer (RDL) pattern and exposing the through-silicon hole and at least another opening corresponding to another redistribution layer (RDL) pattern and connecting to the at least one opening;
   performing at least three electrochemical deposition (ECD) processes for forming a conductive layer to fill the through-silicon hole, the at least one opening and the at least another opening in the patterned resist so as to form a through-silicon via, a through-silicon via RDL pattern and another RDL pattern in one structure; and
   removing the liner and the barrier layer after forming the through-silicon via, the through-silicon via RDL pattern and another RDL pattern.

2. The method of claim 1, further comprising:
   forming a barrier layer on the substrate and a bottom and sidewalls of the through-silicon hole;
   forming the patterned resist on the barrier layer;
   forming the conductive layer on the barrier layer to fill the through-silicon hole and the opening in the patterned resist;
   removing the patterned resist for forming the RDL pattern; and
   removing the barrier layer outside the RDL pattern on the substrate.

3. The method of claim 2, wherein the barrier layer is selected from a material consisting of Ta, TaN, Ti, and TiN.

4. The method of claim 1, further comprising performing an electroless deposition for forming the conductive layer in the through-silicon hole and the opening.

5. The method of claim 1, wherein the conductive layer comprises copper.

6. A method for fabricating integrated structure, comprising:
 providing a substrate;
 forming a through-silicon hole in the substrate;
 forming a patterned resist on the substrate, wherein the patterned resist comprises at least one opening corresponding to a redistribution layer (RDL) pattern and exposing the through-silicon hole and at least another opening corresponding to another RDL pattern and connecting to the at least one opening;
 performing a first electrochemical deposition (ECD) process step and a second ECD process step to fill the through-silicon hole; and
 performing a third ECD process step to fill the at least one opening and the at least another opening in the pattern resist.

7. The method of claim 6, further comprising:
 forming a barrier layer on the substrate and a bottom and sidewalls of the through-silicon hole;
 forming the patterned resist on the barrier layer;
 performing the first ECD process step and the second ECD process step to form a conductive layer for filling the through-silicon hole;
 performing the third ECD process step to fill the at least one opening and the at least another opening in the patterned resist for forming a through-silicon via RDL pattern and another RDL pattern;
 removing the patterned resist; and
 removing the barrier layer outside the through-silicon via RDL pattern and the another RDL pattern on the substrate.

8. The method of claim 7, wherein the barrier layer is selected from a material consisting of Ta, TaN, Ti, and TiN.

9. The method of claim 7, wherein the conductive layer comprises copper.

* * * * *